United States Patent
Rana et al.

(10) Patent No.: US 10,147,493 B2
(45) Date of Patent: Dec. 4, 2018

(54) SYSTEM ON-CHIP (SOC) DEVICE WITH DEDICATED CLOCK GENERATOR FOR MEMORY BANKS

(71) Applicant: SAMSUNG ELECTRONICS CO., LTD., Suwon-si (KR)

(72) Inventors: Parvinder Kumar Rana, Bangalore (IN); Lava Kumar Pulluru, Bangalore (IN); Manish Chandra Joshi, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/665,988

(22) Filed: Aug. 1, 2017

(65) Prior Publication Data

US 2018/0174657 A1    Jun. 21, 2018

(30) Foreign Application Priority Data

Dec. 20, 2016  (IN) .............................. 201641043527

(51) Int. Cl.
*G11C 16/32* (2006.01)
*G11C 16/08* (2006.01)

(52) U.S. Cl.
CPC .............. *G11C 16/32* (2013.01); *G11C 16/08* (2013.01)

(58) Field of Classification Search
CPC .................................. G11C 16/32; G11C 16/08
See application file for complete search history.

(56) References Cited

U.S. PATENT DOCUMENTS

| | | | |
|---|---|---|---|
| 7,369,453 B2 | 5/2008 | Kim | |
| 2010/0214857 A1* | 8/2010 | Hsu | G11C 7/1042 365/191 |
| 2017/0235352 A1* | 8/2017 | Kumar | G06F 1/266 713/330 |

* cited by examiner

*Primary Examiner* — Tri Hoang
(74) *Attorney, Agent, or Firm* — Sughrue Mion, PLLC

(57) ABSTRACT

A system on-chip (SoC) device is provided. The SoC device includes an on-chip memory including memory banks, and internal clock generators. Each internal clock generator is coupled to one or more memory banks. Each internal clock generator generates one or more of an internal clock signal, a control signal and a clock reset signal locally for the memory bank to which the internal clock generator is coupled.

12 Claims, 7 Drawing Sheets

SYSTEM ON-CHIP (SOC) DEVICE WITH DEDICATED CLOCK GENERATOR FOR MEMORY BANKS

CROSS REFERENCE TO RELATED APPLICATION

This application claims priority from Indian Patent Application No. 201641043527, which was filed on Dec. 20, 2016 in the Indian Intellectual Property Office, the entire disclosure of which is herein incorporated by reference.

BACKGROUND

1. Field

Apparatuses and methods consistent with the present disclosure relate in general to semiconductor memory devices and more particularly to a system on-chip (SoC) device with dedicated clock generator for memory banks.

2. Description of the Related Art

In general, memory devices include a system on chip (SoC) device with a common clock generator that provides a common clock signal to various memory banks. The common clock signal is used to provide control signals to the various memory banks. However, there is a clock path delay in routing the control signals to the memory banks by the common clock signal, which inevitably affects the performance of the SoC device 100. For example, the delay may be caused by occurrence of parasitic loss in wires. The clock-path delay is different for different memory banks leading to hampering of performance of the SoC, and internal hold margins for critical signals are different for each memory bank that leads to take more time and effort for closure.

SUMMARY

One or more example embodiments provide a system on-chip (SoC) device with dedicated clock generator for memory banks.

In accordance with an aspect of an example embodiment, a system on-chip (SoC) device includes at least one on-chip memory including a plurality of memory banks; and a plurality of internal clock generators, each of the plurality of internal clock generators being coupled to at least one memory bank from among the plurality of memory banks and configured to generate at least one of an internal clock signal, a first control signal and a clock reset signal locally for the at least one memory bank.

In accordance with another aspect of an example embodiment, a system on-chip (SoC) integrated method includes generating, by each of a plurality of internal clock generators, at least one of an internal clock signal, a first control signal, and a clock reset signal locally for at least one memory bank from among a plurality of memory banks, wherein each of the plurality of internal clock generators is coupled to the at least one memory bank.

In accordance with an aspect of another example embodiment, a system on-chip device includes: a plurality of memory banks; and a plurality of internal clock generators, each of the plurality of internal clock generators being coupled to at least one memory bank of the plurality of memory banks, wherein each of the plurality of internal clock generators is configured to receive an external clock signal and an enable signal, and to generate an internal clock signal and a control signal locally for the at least one memory bank, based on the external clock signal and the enable signal.

BRIEF DESCRIPTION OF FIGURES

The above and other aspects will be better appreciated and understood when considered in conjunction with the following description and the accompanying drawings, in which.

DETAILED DESCRIPTION

Figure 1:
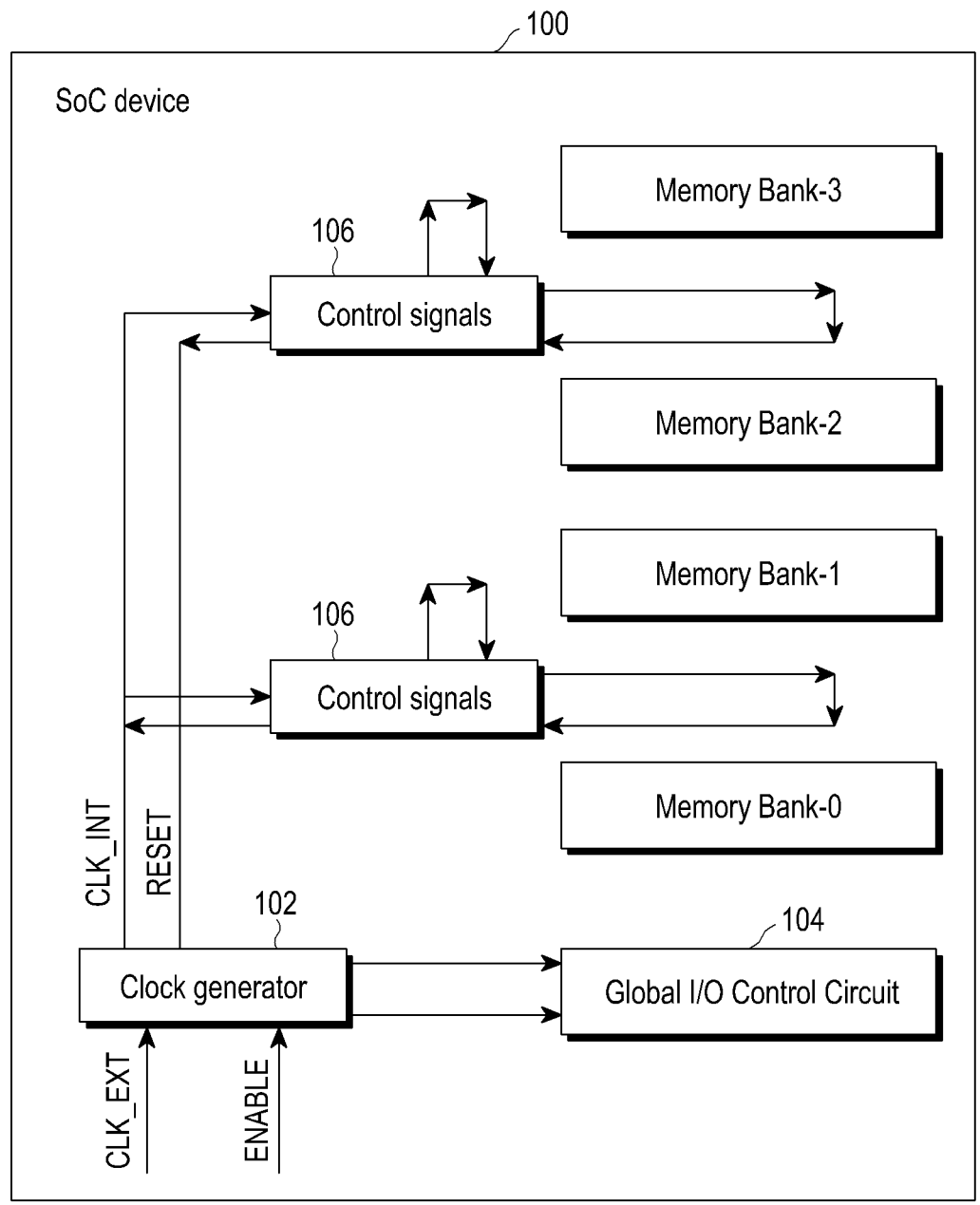
FIG. 1 illustrates a system on chip (SoC) device with a multi-memory banks architecture associated with a common clock generator, according to the related art.

Example embodiments herein and the various features and advantageous details thereof are explained more fully with reference to the non-limiting example embodiments that are illustrated in the accompanying drawings and detailed in the following description. Descriptions of well-known components and processing techniques are omitted so as to not unnecessarily obscure the example embodiments herein. Also, the various example embodiments described herein are not necessarily mutually exclusive, as some example embodiments can be combined with one or more other example embodiments to form new example embodiments. The term "or" as used herein, refers to a non-exclusive or, unless otherwise indicated. The examples used herein are intended merely to facilitate an understanding of ways in which the example embodiments herein can be practiced and to further enable those skilled in the art to practice the example embodiments described herein. Accordingly, the examples should not be construed as limiting the scope of the example embodiments herein.

As is traditional in the field, example embodiments may be described and illustrated in terms of blocks which carry out a described function or functions. These blocks, which may be referred to herein as units or modules or the like, are physically implemented by analog or digital circuits such as logic gates, integrated circuits, microprocessors, microcontrollers, memory circuits, passive electronic components, active electronic components, optical components, hardwired circuits, or the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the example embodiments may be physically separated into two or more interacting and discrete blocks without departing from the scope of the present disclosure. Likewise, the blocks of the example embodiments may be physically combined into more complex blocks without departing from the scope of the present disclosure.

In general, memory device(s) include a system on chip (SoC) circuit (e.g., a processor, integrated circuits (IC), etc.) accompanied by a plurality of on-chip memory devices including read-only memories (ROMs) for storing an instructions set for the processor, a memory to which the processor may write data and from which the processor may read data, and register files (used inside multi-core processors). The processor may communicate with an external cache memory, which is generally a static random access memory (SRAM). The processor may also communicate with numerous peripheral devices, such as, e.g., input devices, output devices, and/or data storage devices, etc. The on-chip memories includes two types of hardware circuits: (1) a bitcell array including an array of bitcells, each bitcell storing 1-bit of data, and (2) periphery circuit including logic gates circuits to control read and write operations.

In order to meet performance goals and processing requirements of the processor (or, an electronic device including the processor) often the SoC circuit/devices are implemented with multi-bank on-chip memory device (or, circuits) architectures as shown in FIG. 1 where, for example, an SoC with multi-bank (i.e., SRAM) architecture is illustrated.

Referring to the FIG. 1, an SoC device 100 may include an array of bit cells organized into four memory banks (i.e., memory banks 0-3), and periphery circuitry including a common clock generator 102, a global I/O control circuit 104, address latches and an address-decoder. The common clock generator 102 generates an internal clock (CLK_INT) signal using an external clock (CLK_EXT) 0 and a macro enable signal (Enable) received from a circuit external to the SoC device 100. The global I/O control circuit 104 includes data latches and output latches that are used to control the common clock generator 102. As shown in FIG. 1, each set of memory banks (memory banks 0-1 and memory banks 2-3) operates according to some common control signals 106 such as a sense amplifier control signal, a pre-charge device control signal, a bit-line driver control signal, and a row decoder enable, etc. The memory bank-0 and memory bank-1 use the common control signals 106, similarly the memory bank-2 and the memory bank-3 use the common control signals 106, and so on. All the common control signals 106 mentioned above are generated using the CLK_INT generated by the common clock generator 102.

There exists a delay (i.e., clock path delay) in routing the common control signals 106 to the memory banks (memory banks 0-3) by the CLK_INT, which inevitably affects the performance of the SoC device 100. For example, a delay due to occurrence of parasitic loss in wire(s) linking the banks and the CLK_INT, or in wire(s) linking the CLK_INT to any other circuit (e.g., CLK_EXT). The clock-path delay is different for different memory banks (memory banks 0-3) leading to hampering of performance of the SoC, and internal hold margins for critical signals are different for each bank that leads to take more time and effort for closure.

In accordance with an example embodiment, a system on-chip (SoC) device may include at least one on-chip memory implemented with a plurality of memory banks, and a plurality of internal clock generators with self-reset mechanism, each internal clock generator coupled to at least one memory bank from the plurality of the memory banks and configured to generate at least one of an internal clock signal, a control signal and a clock reset signal locally for the at least one memory bank.

Unlike the SoC device of FIG. 1 having a multi-memory bank architecture where a common internal clock generator is provided to generate the common control signal(s) 106 thereto routed to the plurality of memory banks, the SoC device according to example embodiments includes a dedicated internal clock generator associated with at least one memory bank (e.g., a dedicated internal clock generator for each set of memory banks) thus obviating the large resistor-capacitor (RC) delay in clock path and improving the performance of the SoC device.

Unlike the SoC device of FIG. 1, the SoC device according to example embodiments includes local reset signals for each set of memory banks.

Referring now to the drawings, and more particularly to FIGS. 2A through 5, where similar reference numbers denote corresponding features consistently throughout the figures, example embodiments are shown.

Figure 2A:
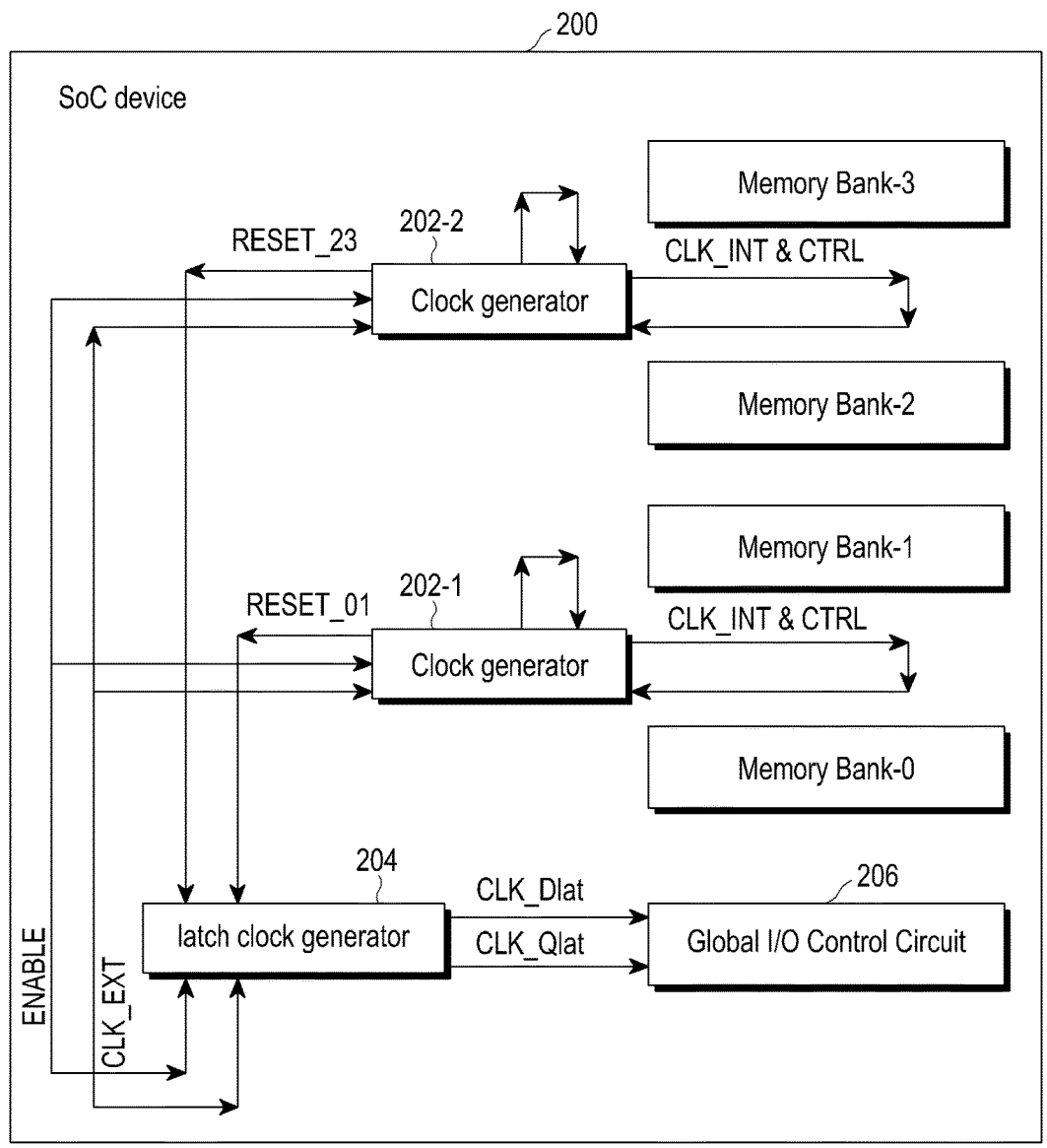
FIG. 2A illustrates an exemplary architecture of a SoC device including a plurality of memory banks and a dedicated clock generator for at least one memory bank, according to an example embodiment.

FIG. 2A illustrates an exemplary architecture of a SoC device 200 including a plurality of memory banks and a dedicated internal clock generator for at least one memory bank, according to an example embodiment.

Referring to FIG. 2A, the SoC device 200 includes at least one on-chip memory implemented with a plurality of memory banks (memory banks 0-3), a plurality of clock generators 202-1, 202-2, each internal clock generator 202 dedicated for at least one memory bank, a latch clock generator 204, and a global input/output control circuit (global I/O control circuit) 206.

The on-chip memory may include, for e.g., an array of memory locations, static random access memory (SRAM) for different levels of cache memories or dynamic random access memory (DRAM), erasable programmable read-only memory (EPROM), ternary content-addressable memory (TCAM) read only memory (ROM) i.e., processors use the ROM for storing instruction set, register files used inside multi-core processors etc.

Each internal clock generator 202 is coupled to at least one memory bank from among a plurality of memory banks. Each internal clock generator 202 is disposed on the SoC device in order to minimize a parasitic loss due to wiring between the internal clock generator 202 and the at least one memory bank to which the internal clock generator 202 is coupled. For example, an internal clock generator 202-1 is provided for a memory bank-0 and a memory bank-1, and an internal clock generator 202-2 is provided for a memory bank-2 and a memory bank-3, in the example shown in FIG. 2A. In this case, the internal clock generator 202-1 is disposed on the SoC to minimize a parasitic loss due to wiring between the internal clock generator 202-1 and the memory bank-0 and the memory bank-1. Similarly, the internal clock generator 202-2 is disposed on the SoC to minimize a parasitic loss due to wiring between the internal clock generator 202-2 and the memory bank-2 and the memory bank-3. However, this is only an example, and in other example embodiments, the number of memory banks coupled to each clock generator may be one or more than two. The internal clock generator 202 is configured to generate at least one of an internal clock signal, a control signal (i.e., a first control signal) and the clock reset signal local for the at least one memory bank, based on an external clock signal and an enable signal. That is, for example, the internal clock generator 202-1 is configured to generate at least one of the internal clock signal, the control signal and the clock reset signal locally for the memory bank-0 and the memory bank-1, based on the external clock signal CLK_EXT and enable signal ENABLE.

For example, as illustrated in the FIG. 2A, a dedicated internal clock generator 202 is provided for each set of memory banks i.e., between the memory bank-0 and the memory bank-1 and between the memory bank-2 and the memory bank-3. The internal clock generator 202-1 between the memory bank-0 and the memory bank-1 may be configured to generate at least one of the internal clock signal CLK_INT, the control signal CTRL, and the clock reset signal RESET_01 locally for the memory bank-0 and the memory bank-1, based on the external clock signal CLK_EXT and enable signal ENABLE. Similarly, the internal clock generator 202-2 between the memory bank-2 and memory bank-3 may be configured to generate at least one of the internal clock signal CLK_INT, the control signal CTRL, and the clock reset signal RESET_23 locally for the memory bank-2 and the memory bank-3, based on the external clock signal CLK_EXT and enable signal ENABLE. In other example embodiments, an internal clock generator 202 may be provided for each memory bank (i.e., in a one-to-one relationship rather than one internal clock generator 202 for two memory banks as shown in FIG. 2A). In such a case, the internal clock generator 202 may be configured to provide the at least one of the internal clock signal, the control signal, and the clock reset signal locally for the memory block to which the internal clock generator 202 is provided.

Unlike in the SoC device 100 of FIG. 1, where the common clock generator 102 generates a common clock signal for all the memory banks, the SoC device 200 according to an example embodiment provides the clock reset signal/scheme locally to each memory bank to effectively manage all conditions. For example, in a case of an architecture including four memory banks, according to the example embodiment shown in FIG. 2A, a total number of internal clock generators 202 and the clock reset signals may be two respectively (i.e., one for each set of the memory banks). In other words, one internal clock generator 202 and one clock reset signal may be provided for two memory banks, as shown in FIG. 2A.

The control signal CTRL includes, for example, at least one of a sense amplifier control signal, a pre-charge device control signal, a bit-line driver control signal, a row decoding logic signal, and a word line control signal (WL control signal).

Unlike the SoC device 100 of FIG. 1, the SoC device 200 according to an example embodiment may control (or, in some cases eliminate) the delay from internal clock (CLK_INT) to generate the control signal CTRL and the clock reset signal (i.e., RESET_01 and RESET_23) thereby improving the overall performance of the SoC device 200.

Unlike the SoC device 100 of FIG. 1, the robustness of the architecture is independent of the number of memory banks in the memory bank architecture as illustrated in the FIG. 2A, since all the relative signals are local to each of the memory bank. Further, the Internal hold margin between CLK_INT and address/data inputs is the same across all the memory banks. Thus, no additional time is required to meet the robustness requirement. This aids in achieving higher performance of the SoC device 200. Furthermore, the Read Margin is the same across all the memory banks, the sense amplifier differential is the same across all the memory banks, and the write margin is the same across the memory banks. Accordingly, writability is the same across all the memory banks.

Further, the aforementioned on-chip memories are accompanied with one or more hardware circuits, e.g., a Bitcell Array including array of bitcells, where each bitcell is configured to store 1-bit of data, and periphery circuitry including logic gates to control read and write operations.

The periphery circuits may be, for example, the internal clock generator 202, the global I/O control circuit 206, address latches and/or an address-decoder.

In another example embodiment, the latch clock generator 204 may be configured to receive the clock reset signals (i.e., RESET_01 and RESET_23) from the internal clock generators 202 and the external clock signal CLK_EXT and the enable signal ENABLE, and to generate the D-latch clock CLK_Dlat and the Q-latch clock CLK_Qlat, based on the clock reset signals, the external clock signal and the enable signal, wherein rising edge of the internal clock signal is governed by a rising edge of the external clock signal rise, and a falling edge of the internal clock signal is governed by a falling edge of the external clock signal, and the internal clock signal is generated from each of the internal clock generators 202. The global I/O control circuit 206 may be configured to receive the D-latch clock CLK_Dlat and the Q-latch clock CLK_Qlat from the latch clock generator 204 for managing Input-Output latches.

Figure 2B:
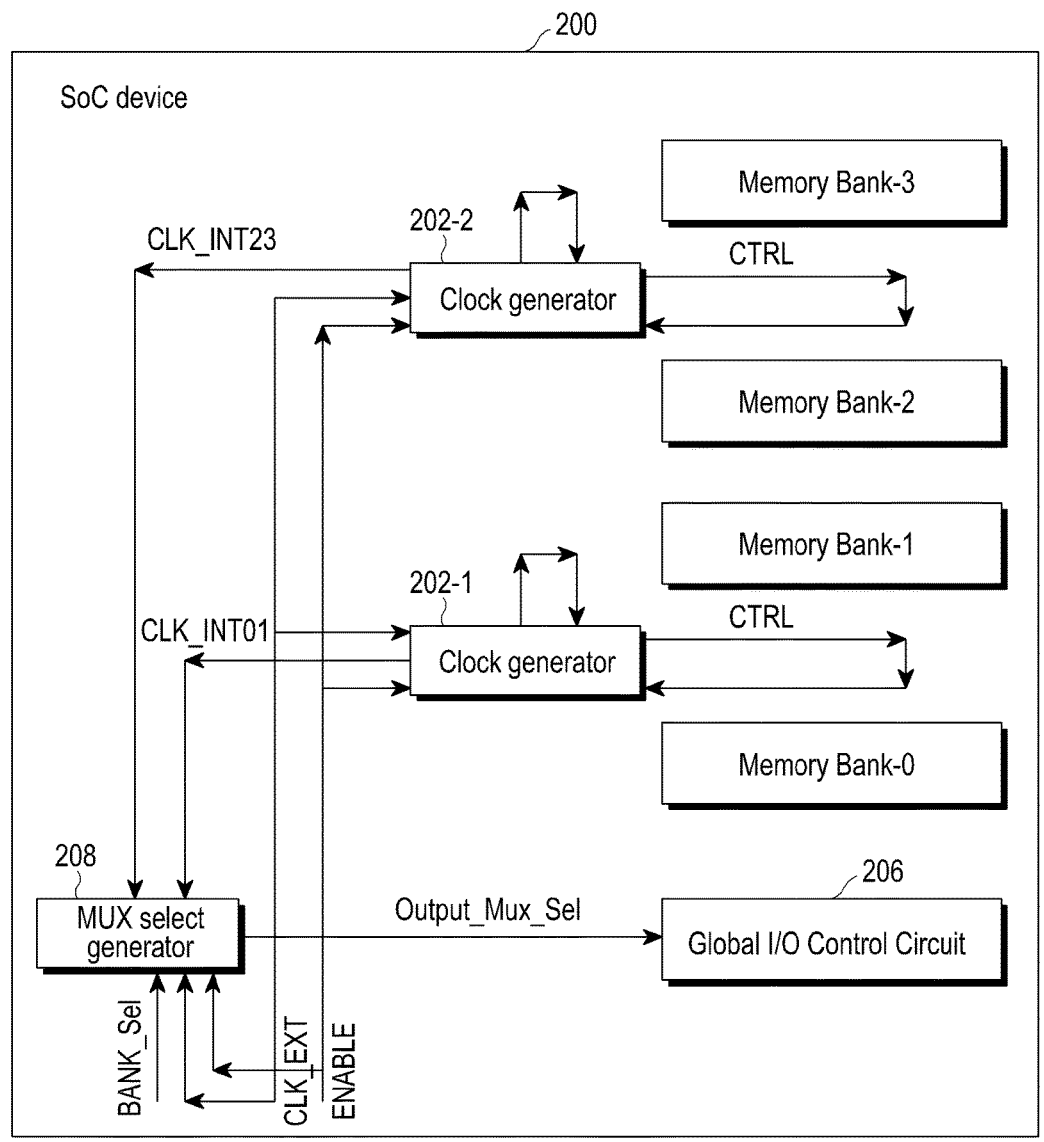
FIG. 2B illustrates a SoC device that includes generation of an output MUX select from locally generated signals, according to an example embodiment.

In yet another example embodiment, the SoC device 200 includes a multiplexer select generator (MUX select generator) 208 configured to receive the internal clock signals (CLK_INT01 and CLK_INT23) from each internal clock generator 202, a plurality of addresses of the plurality of memory banks (BANK_Sel), an external clock signal CLK_EXT, an enable signal ENABLE and generate a multiplexer select signal (MUX select signal) based on the internal clock signals, the addresses, the external clock signal, and the enable signal. Further, the SoC device 200 includes a global I/O control circuit 206 configured to receive the signal (Output_Mux_Sel) outputted from the MUX select generator 208 for managing an output multiplexer, as shown in FIG. 2B. Components in FIG. 2B that have with the same reference designators as those in FIG. 2A are the same and a repeated description thereof is omitted.

Referring to the FIG. 2B, the D-latch and Q-latch may be provided locally to the each set of memory banks (by placing the D-latch and the Q-latch between two memory banks (0 and 1, or 2 and 3). In other words, a D-latch and a Q-latch may be provided in each internal clock generator 202. Thus, the MUX select generator 208 may provide the Output_Mux_Sel signal to the global I/O control circuit 206. The MUX select generator 208 selects signal (Output_Mux_Sel), as detailed in FIG. 2C.

Figure 2C:
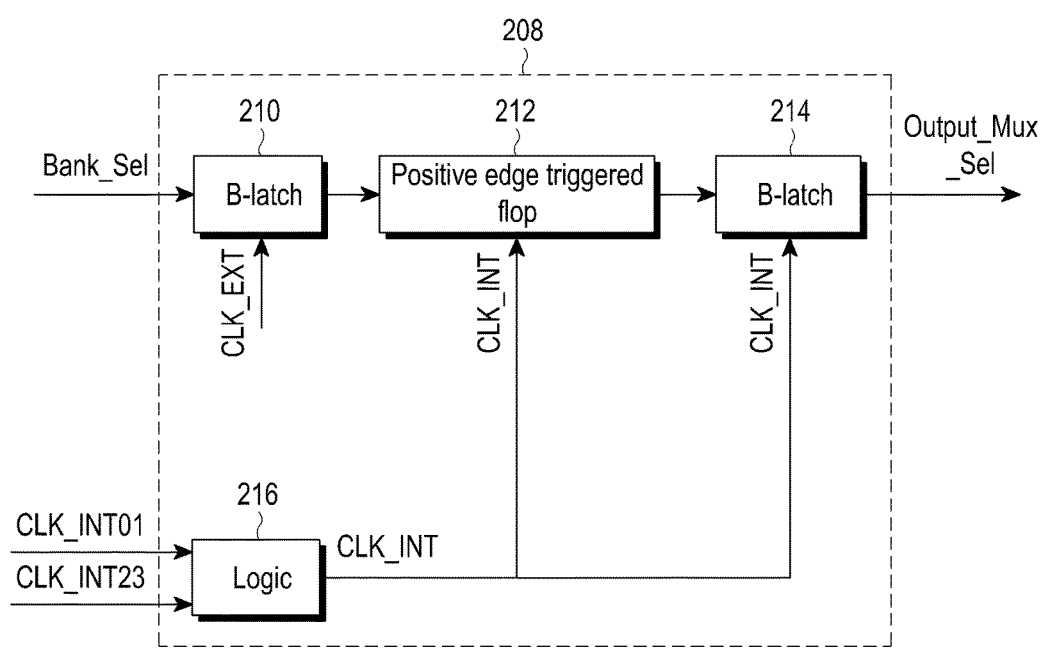
FIG. 2C illustrates generation of a column MUX select signal using locally generated signals, according to an example embodiment.

FIG. 2C shows implementation details of MUX select generator 208. The MUX select signal (Output_Mux_Sel) decides final output from outputs from each of the memory banks. The circuit contains a first B-latch 210, controlled using the external clock CLK_EXT, followed by a positive edge triggered flop 212 and a second B-latch 214. The positive edge triggered flop 212 and the second B-latch 214 are controlled by CLK_INT. CLK_INT is derived from CLK_INT01 and CLK_INT23 using logic 216. In other words, as shown in FIG. 2C, the MUX select generator includes the logic 216 that receives the internal clock signals CLK_INT01, CLK_INT23 from the internal clock generators 202, and generates a signal CLK_INT based on the internal clock signals CLK_INT01, CLK_INT23, the first B-latch 210 that receives the memory bank select signal Bank_Sel and the external clock signal CLK_EXT, the positive edge triggered flop 212 that receives a first output of the first B-latch 210 and the signal CLK_INT generated by the logic 216, and the second B-latch 214 that receives a second output from the positive edge triggered flop 212 and the signal CLK_INT generated by the logic 216, and outputs the output mux select signal Output_Mux_Sel.

While FIGS. 2A, 2B and 2C illustrates the SoC device 200 according to various example embodiments, the present disclosure is not limited thereto. For example, in some example embodiments, the SoC device 200 may include fewer or more components than those shown in FIGS. 2A, 2B and 2C. Additionally, the labels and/or names of the components of the SoC device 200 are provided only for illustrative purpose and do not limit the scope of the example embodiments. For example, one or more components may be combined together to perform the same or substantially similar function in the SoC device 200.

Figure 3:
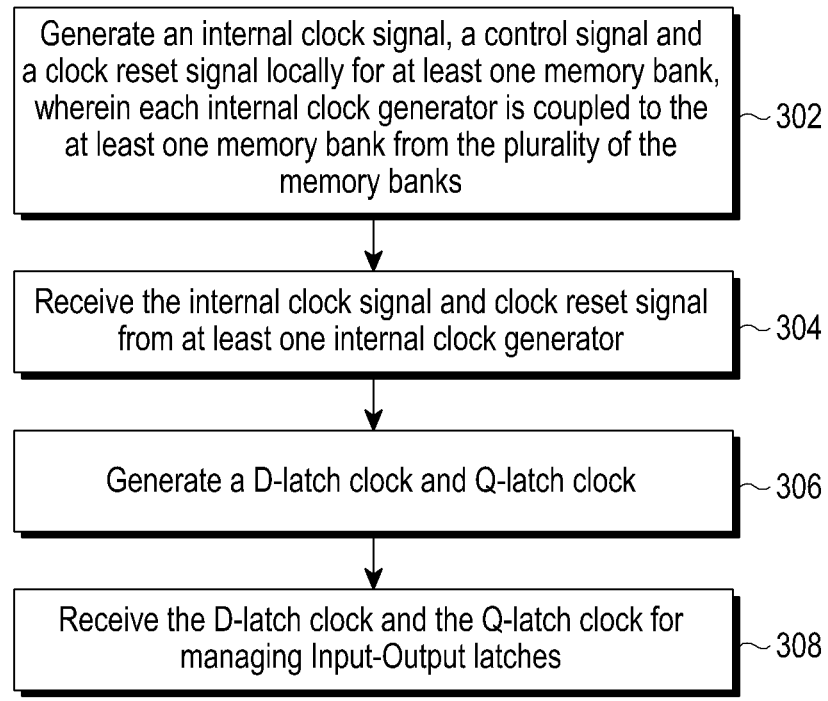
FIG. 3 is a flow diagram illustrating a method implemented in a SoC device, according to an example embodiment.

FIG. 3 is a flow diagram illustrating a method implemented in the SoC device 200, according to an example embodiment.

Referring to FIG. 3, in operation 302, the SoC device 200 generates the internal clock signal, the control signal, and the clock reset signal locally for the at least one memory bank, wherein the internal clock generator 202 is coupled to the at least one memory bank from the plurality of the memory banks. For example, in the SoC device 200, as illustrated in the FIG. 2A, the internal clock generator 202-1 is configured to generate the internal clock signal CLK_INT, the control signal CTRL and the clock reset signal RESET_01 locally for the Memory Bank-0 and Memory Bank-1, wherein the internal clock generator 202-1 is coupled to the Memory Bank-0 and Memory Bank-1 from the plurality of the memory banks (memory banks 0-3).

In operation 304, the SoC device 200 receives the external clock signal CLK_EXT from an external clock and the clock reset signal RESET_01 from the internal clock generator 202-1. The SoC device 200 may also receive the clock reset signal RESET_23 from the internal clock generator 202-2. For example, in the SoC device 200, as illustrated in the FIG. 2A, the latch clock generator 204 is configured to receive the external clock signal CLK_EXT from the external clock and the clock reset signal RESET_01 from the internal clock generator 202-1. The latch clock generator 204 may also receive the clock reset signal RESET_23 from the internal clock generator 202-2.

In operation 306, the SoC device 200 generates the D-latch clock CLK_Dlat and the Q-latch clock CLK_Qlat, wherein rising edge of the internal clock signal is governed by a rising edge of the external clock signal, and a falling edge of the internal clock signal is governed by a falling edge of the external clock signal. The global I/O control circuit 206 may be configured to receive the D-latch clock CLK_Dlat and the Q-latch clock CLK_Qlat from the at least one memory bank for managing Input-Output latches. For example, in the SoC device 200, as illustrated in the FIG. 2A, the latch clock generator 204 may be configured to generate the D-latch clock CLK_Dlat and the Q-latch clock CLK_Qlat, wherein rising edge of the internal clock signal is governed by a rising edge of the external clock signal rise, and a falling edge of the internal clock signal is governed by a falling edge of the external clock signal.

In operation 308, the SoC device 200 receives the D-latch clock and the Q-latch clock for managing Input-Output latches. For example, the global I/O control circuit 206 can be configured to receive the D-latch clock CLK_Dlat and the Q-latch clock CLK_Qlat for managing Input-Output latches.

The various actions, acts, blocks, operations, or the like in the flow chart 300 may be performed in the order presented, in a different order or simultaneously. Further, in some example embodiments, some of the actions, acts, blocks, operations, or the like may be omitted, added, modified, skipped, or the like without departing from the scope of the present disclosure.

Figure 4:
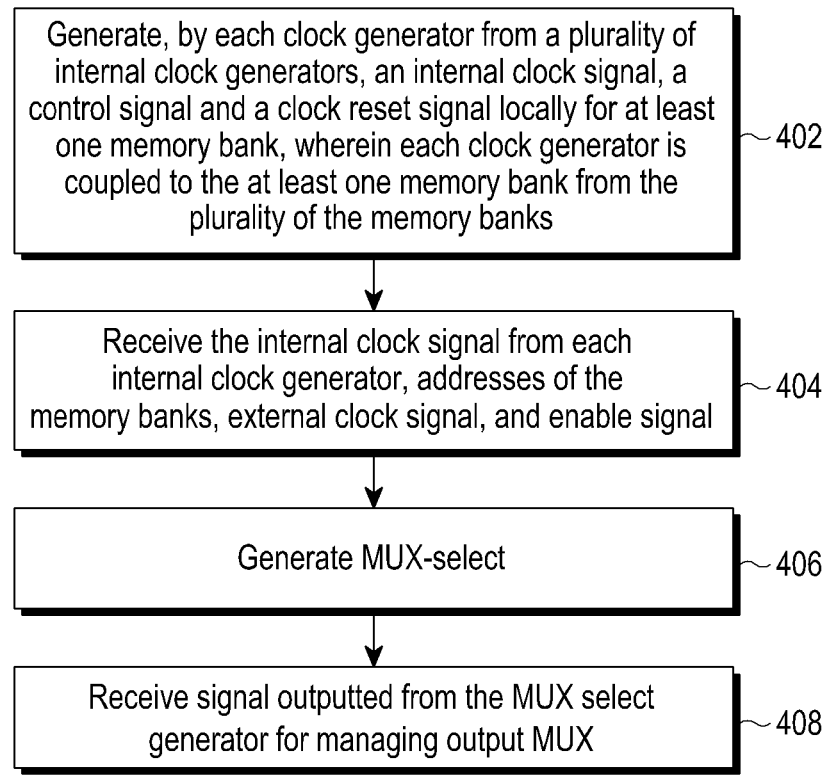
FIG. 4 is another flow diagram illustrating a method implemented in a SoC device, according to an example embodiment.

FIG. 4 is a flow diagram illustrating a method implemented in an SoC device 200, according to an example embodiment.

Referring to the FIG. 4, in operation 402, the SoC device 200 generates, by each clock generator, the internal clock signal, the control signal and the clock reset signal locally for the at least one memory bank, wherein each the internal clock generator is coupled to at least one memory bank from the plurality of the memory banks. For example, in the SoC device 200, as illustrated in the FIG. 2B, the internal clock generator 202-1 is configured to generate at least one of the internal clock signal CLK_INT01, the control signal CTRL, and the clock reset signal RESET_01 locally for the Memory Bank-0 and the Memory Bank-1, wherein the internal clock generator 202-1 is coupled to the Memory Bank-0 and the Memory Bank-1, and the internal clock generator 202-2 is configured to generate at least one of the internal clock signal CLK_INT23, the control signal CTRL, and the clock reset signal RESET_23 locally for the Memory Bank-2 and the Memory Bank-3, wherein the internal clock generator 202-2 is coupled to the Memory Bank-2 and the Memory Bank-3.

In operation 404, the SoC device 200 receives the internal clock signal from each internal clock generator 202, the addresses of the plurality of memory banks, and external clock signal and enable signal. For example, in the SoC device 200, as illustrated in the FIG. 2B, the MUX select generator 208 may be configured to receive the internal clock signal from each internal clock generator 202 (CLK_INT01, CLK_INT23), the addresses of the plurality of memory banks BANK_Sel, the external clock signal CLK_EXT, and the enable signal ENABLE.

In operation 406, the SoC device 200 generates the MUX select signal. For example, in the SoC device 200, as illustrated in the FIG. 2B, the MUX select generator 208 may be configured to generate the MUX select signal Output_MUX_Sel.

In operation 408, the SoC device 200 receives signal outputted from the MUX select generator 208 for managing the output MUX. For example, in the SoC device 200, as illustrated in the FIG. 2B, the global I/O control circuit 206 may be configured to receive the MUX select signal Output_MUX_Sel outputted from the MUX select generator 208 for managing the output MUX.

The various actions, acts, blocks, operations, or the like in the flow chart 400 may be performed in the order presented, in a different order or simultaneously. Further, in some example embodiments, some of the actions, acts, blocks, operations, or the like may be omitted, added, modified, skipped, or the like without departing from the scope of the present disclosure.

Figure 5:
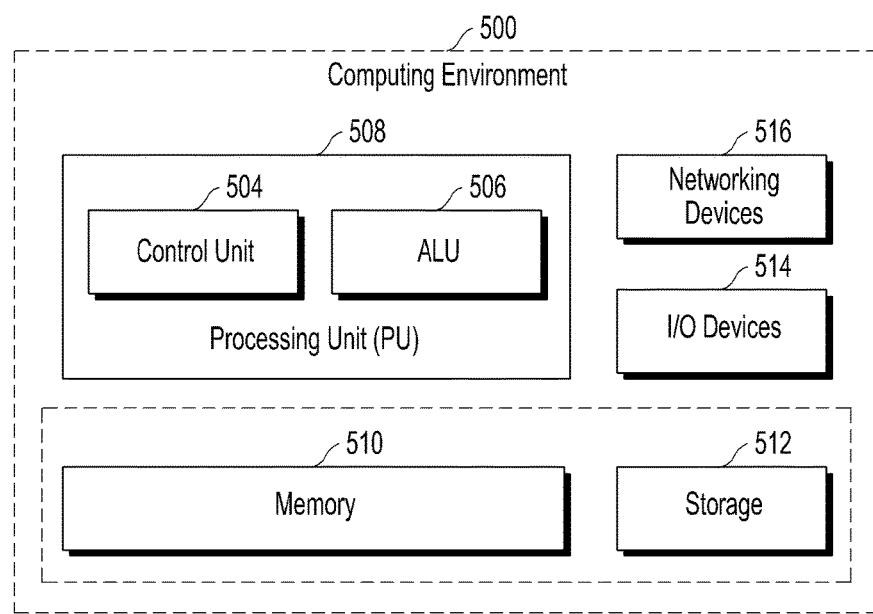
FIG. 5 illustrates a computing environment implementing a method in a SoC device, according to an example embodiment.

FIG. 5 illustrates a computing environment implementing the SoC device of the above example embodiments, according to an example embodiment. As depicted in FIG. 5, the computing environment 500 comprises at least one processing unit (PU) 508 that is equipped with a control unit 504 and an Arithmetic Logic Unit (ALU) 506, a memory 510, a storage 512, plurality of networking devices 516 and a plurality of input/output (I/O) devices 514. The processing unit 508 is responsible for processing instructions. The processing unit 508 receives commands from the control unit in order to perform the processing. Further, any logical and arithmetic operations involved in the execution of the instructions are computed using the ALU 506.

The overall computing environment 500 may include multiple homogeneous and/or heterogeneous cores, multiple central processing units (CPUs) of different kinds, special media and other accelerators. The processing unit 508 is responsible for processing instructions. Further, the plurality of processing unit 508 may be located on a single chip or over multiple chips.

Instructions and codes are stored in either the memory 510 or the storage 512 or both. At the time of execution, the instructions may be fetched from the corresponding memory 510 or storage 512, and executed by the processing unit 508.

In case of any hardware implementations, various networking devices 516 and/or I/O devices 514 may be connected to the computing environment to support the implementation through a networking unit and an I/O device unit. The I/O devices 514 may be external.

The example embodiments disclosed herein can be implemented through at least one software program running on at least one hardware device and performing network management functions to control the elements. The elements shown in the FIGS. 2A through 5 include blocks which may be at least one of a hardware device, or a combination of a hardware device and a software module.

The foregoing description of the specific example embodiments will so fully reveal the general nature of the example embodiments herein that others can, by applying current knowledge, readily modify or adapt for various applications such specific example embodiments without departing from the inventive concept, and, therefore, such adaptations and modifications should and are intended to be comprehended within the meaning and range of equivalents of the disclosed example embodiments. It is to be understood that the phraseology or terminology employed herein is for the purpose of description and not of limitation. Therefore, while various example embodiments herein have been described, those skilled in the art will recognize that the example embodiments herein can be practiced with modification within the spirit and scope of the example embodiments as described herein.

What is claimed is:

1. A system on-chip device comprising:
   at least one on-chip memory comprising a plurality of memory banks; and
   a plurality of internal clock generators, each of the plurality of internal clock generators being coupled to at least one memory bank from among the plurality of memory banks and configured to generate at least one of an internal clock signal, a first control signal and a clock reset signal locally for the at least one memory bank,
   wherein each of the plurality of internal clock generators is further configured to generate the internal clock signal and the clock reset signal, and
   wherein the system on-chip device further comprises:
   a latch clock generator configured to:
   receive the clock reset signal from each of the plurality of internal clock generators and an external clock signal, and
   generate a D-latch clock and Q-latch clock based on the clock reset signal from each of the plurality of internal clock generators and the external clock signal; and
   a global input/output control circuit configured to receive the D-latch clock and the Q-latch clock for managing Input-Output latches.

2. The system on-chip device of claim 1,
   wherein each of the plurality of internal clock generators is configured to generate the internal clock signal, and
   wherein the system on-chip device further comprises:
   a multiplexer select generator configured to:
   receive the internal clock signal from each of the plurality of internal clock generators, a plurality of addresses of the plurality of memory banks, and an external clock signal, and
   generate a multiplexer select signal based on the internal clock signal from each of the plurality of internal clock generators, the plurality of addresses of the plurality of memory banks, and the external clock signal; and
   a global input/output circuit configured to receive the multiplexer select signal for managing an output multiplexer.

3. The system on-chip device of claim 1, wherein the first control signal comprises at least one of a sense amplifier control signal, a pre-charge device control signal, a bit-line driver control signal, a row decoding logic signal, and a word line control signal.

4. A method implemented in a system on-chip, the method comprising:
   generating, by each of a plurality of internal clock generators, at least one of an internal clock signal, a first control signal, and a clock reset signal locally for at least one memory bank from among a plurality of memory banks, wherein each of the plurality of internal clock generators is coupled to the at least one memory bank,
   wherein each of the plurality of internal clock generators generates the internal clock signal and the clock reset signal, and
   wherein the method further comprises:
   receiving, by a latch clock generator, the clock reset signal from each of the plurality of internal clock generators and an external clock signal;
   generating, by the latch clock generator, a D-latch clock and Q-latch clock based on the clock reset signal from each of the plurality of internal clock generators and the external clock signal; and
   receiving, by a global input/output circuit, the D-latch clock and the Q-latch clock for managing Input-Output latches.

5. A method implemented in a system on-chip, the method comprising:
   generating, by each of a plurality of internal clock generators, at least one of an internal clock signal, a first control signal, and a clock reset signal locally for at least one memory bank from among a plurality of memory banks, wherein each of the plurality of internal clock generators is coupled to the at least one memory bank,
   wherein each of the plurality of internal clock generators generates the internal clock signal, and
   wherein the method further comprises:
   receiving, by a multiplexer select generator, the internal clock signal from each of the plurality of internal clock generators, a plurality of addresses of the plurality of memory banks, and an external clock signal;

generating, by a multiplexer select generator, a multiplexer select signal based on the internal clock signal from each of the plurality of internal clock generators, the plurality of addresses, and the external clock signal; and
receiving, by a global input/output circuit, the multiplexer select signal for managing an output multiplexer.

6. The method of claim 4, wherein the first control signal comprises at least one of a sense amplifier control signal, a pre-charge device control signal, a bit-line driver control signal, a row decoding logic signal, and a word line control signal.

7. A system on-chip device comprising:
a plurality of memory banks;
a plurality of internal clock generators, each of the plurality of internal clock generators being coupled to at least one memory bank of the plurality of memory banks; and
a multiplexer select generator configured to receive an internal clock signal from each of the plurality of internal clock generators, an enable signal, an external clock signal, and a memory bank select signal, and to generate an output mux select signal from the memory bank select signal, the internal clock signal from each of the plurality of internal clock generators, the external clock signal and the enable signal,
wherein each of the plurality of internal clock generators is configured to receive the external clock signal and the enable signal, and to generate the internal clock signal and a control signal locally for the at least one memory bank, based on the external clock signal and the enable signal.

8. The system on-chip device of claim 7, wherein each of the plurality of internal clock generators is configured to generate a clock reset signal, and
wherein the system on-chip device further comprises a latch clock generator configured to receive the clock reset signal from each of the plurality of internal clock generators, the enable signal, and the external clock signal, and to generate a D-latch clock and a Q-latch clock based on the clock reset signal from each of the plurality of internal clock generators, the external clock signal and the enable signal.

9. The system on-chip device of claim 7, wherein the multiplexer select generator comprises:
a logic that receives the internal clock signal from each of the plurality of internal clock generators, and generates a signal based on the internal clock signal from each of the plurality of internal clock generators;
a first B-latch that receives the memory bank select signal and the external clock signal;
a positive edge triggered flop that receives a first output of the first B-latch and the signal generated by the logic;
a second B-latch that receives a second output from the positive edge triggered flop and the signal generated by the logic, and outputs the output mux select signal.

10. The system on-chip device of claim 7, wherein the control signal comprises at least one of a sense amplifier control signal, a pre-charge device control signal, a bit-line driver control signal, a row decoding logic signal, and a word line control signal.

11. The system on-chip device of claim 7, wherein each of the plurality of internal clock generators is configured to minimize a parasitic loss due to wiring between each of the plurality of internal clock generators and the at least one memory bank to which each of the plurality of internal clock generators is coupled.

12. The system on-chip device of claim 1, wherein each of the plurality of internal clock generators is configured to minimize a parasitic loss due to wiring between each of the plurality of internal clock generators and the at least one memory bank to which each of the plurality of internal clock generators is coupled.

* * * * *